US012553147B2

(12) United States Patent
Ciraldo et al.

(10) Patent No.: US 12,553,147 B2
(45) Date of Patent: Feb. 17, 2026

(54) SELECTIVE DEPOSITION OF DIAMOND

(71) Applicant: Advanced Diamond Holdings, LLC, Beltsville, MD (US)

(72) Inventors: John P. Ciraldo, Clarksburg, MD (US); Joshua Blackketter, Laurel, MD (US); Jonathan Levine-Miles, Silver Spring, MD (US)

(73) Assignee: Advanced Diamond Holdings, LLC, Beltsville, MD (US)

( * ) Notice: Subject to any disclaimer, the term of this patent is extended or adjusted under 35 U.S.C. 154(b) by 259 days.

(21) Appl. No.: 18/229,051

(22) Filed: Aug. 1, 2023

(65) Prior Publication Data

US 2024/0318349 A1 Sep. 26, 2024

Related U.S. Application Data

(60) Provisional application No. 63/453,378, filed on Mar. 20, 2023.

(51) Int. Cl.

| | |
|---|---|
| ***C30B 29/04*** | (2006.01) |
| ***C30B 25/04*** | (2006.01) |
| ***C30B 25/20*** | (2006.01) |
| ***C30B 33/08*** | (2006.01) |

(52) U.S. Cl.

CPC .............. *C30B 25/04* (2013.01); *C30B 25/20* (2013.01); *C30B 29/04* (2013.01); *C30B 33/08* (2013.01)

(58) Field of Classification Search

CPC ......... C30B 25/04; C30B 25/20; C30B 29/04; C30B 33/08; C23C 16/279; C23C 16/27

See application file for complete search history.

(56) References Cited

U.S. PATENT DOCUMENTS

| | | | | |
|---|---|---|---|---|
| 6,538,368 | B1 | 3/2003 | Fox et al. | |
| 2005/0127373 | A1 | 6/2005 | Yokota et al. | |
| 2012/0047950 | A1 | 3/2012 | Grotjohn et al. | |
| 2021/0222323 | A1 | 7/2021 | Ciraldo et al. | |
| 2021/0222324 | A1 | 7/2021 | Ciraldo et al. | |
| 2021/0285125 | A1 | 9/2021 | Friel et al. | |
| 2021/0320183 | A1 * | 10/2021 | Varghese | H10D 30/01 |

FOREIGN PATENT DOCUMENTS

| | | | |
|---|---|---|---|
| CN | 110938864 | B | 2/2021 |
| CN | 114016127 | A | 2/2022 |
| WO | 1992/022689 | A1 | 12/1992 |

OTHER PUBLICATIONS

Chih, Y., et al., "Formation of nano-scale tubular structure of single crystal diamond," Diamond and Related Materials vol. 13, Mar. 1, 2004. pp. 1614-1617.

(Continued)

*Primary Examiner* — Robert M Kunemund

(74) *Attorney, Agent, or Firm* — Nutter McClennen & Fish LLP

(57) ABSTRACT

A method provides a single-crystal diamond substrate having a growth surface. A diamond growth inhibitor (DGI) is positioned over a diamond inhibition area of the growth surface. A first diamond portion having a first dopant concentration is deposited using chemical vapor deposition over a growth area of the growth surface. The diamond growth inhibitor and non-diamond carbon thereon are removed.

19 Claims, 13 Drawing Sheets

(56) References Cited

OTHER PUBLICATIONS

International Search Report and Written Opinion for International Application No. PCT/US2023/029231, mailed Oct. 31, 2023, 18 pages.
International Search Report and Written Opinion for International Application No. PCT/US2023/029232, mailed Oct. 31, 2023, 18 pages.
Letellier, J., et al., "Diamond Schottky diodes improvement to pave the way to high power electronic application," Micro and nanotechnologies/Microelectronics. Université Grenoble Alpes, Dec. 18, 2019 [retrieved on Sep. 27, 2023]. Retrieved from the internet: <URL: https://theses.hal.science/tel-02929023/document>. pp. i-xvii, and 1-15.
Li, F., et al., "Fabrication of Low Dislocation Density, Single-Crystalline Diamond via Two-Step Epitaxial Lateral Overgrowth," Crystals, vol. 7, No. 114, Apr. 18, 2017 [retrieved on Sep. 29, 2023]. Retrieved from the itnernet: <URL: https://www.mdpi.com/2073-4352/7/4/114>. pp. 1-7.
Liu, H., et al., "Single Crystal Diamond Deposited by Dual Radio-Frequency Plasma Jet CVD with High Growth Rate," Crystals, vol. 9, No. 32, Jan. 10, 2019 [retrieved on Sep. 29, 2023]. Retrieved from the internet: <URL: https://pdfs.semanticscholar.org/3460/5228b47bdc00c7c4ed22f44f19911f3ea712.pdf>. pp. 1-9.
Naamoun, M., et al., "Reduction of dislocation densities in single crystal CVD diamond by using self-assembled metallic masks," Diamond and Related Materials, Jun. 20, 2015, pp. 62-68.

* cited by examiner

SELECTIVE DEPOSITION OF DIAMOND

PRIORITY

This patent application claims priority from provisional U.S. patent application No. 63/453,378, filed Mar. 20, 2023, entitled, "SELECTIVE DEPOSITION OF DIAMOND," the disclosure of which is incorporated herein, in its entirety, by reference.

FIELD OF THE INVENTION

Illustrative embodiments of the invention generally relate to growing diamond and, more particularly, illustrative embodiments relate to diamond having portions with varying dopant concentrations.

BACKGROUND OF THE INVENTION

Progress in power electronic devices is currently accepted through the use of Wide bandgap materials (WBG) are used to in power electronic devices. As an ultra-wide bandgap material, diamond is highly desirable for various electronic applications. However, it is also difficult to manufacture electronics with diamond due to its very high mechanical hardness and smaller size of substrates.

SUMMARY OF VARIOUS EMBODIMENTS

In accordance with one embodiment of the invention, a method grows diamonds. The method provides a single-crystal diamond substrate having a growth surface. A diamond growth inhibitor (DGI) is positioned over a diamond inhibition area of the growth surface. A first diamond portion having a first dopant concentration is deposited using chemical vapor deposition over a growth area of the growth surface. The diamond growth inhibitor and non-diamond carbon thereon are removed.

The diamond growth inhibitor may be configured to cause formation of non-diamond carbon as diamond is deposited in a CVD diamond growth process thereon, when depositing diamond using a chemical vapor deposition growth process. Thus, the diamond growth inhibitor may be configured to cause deposition of unbonded or Sp2 bonded carbon. The diamond growth inhibitor may be configured to prevent or inhibit formation of single-crystal and polycrystalline diamond at a surface of the DGI when depositing diamond using a chemical vapor deposition growth process.

Various embodiments form voids that allow for deposition of differently doped diamond portions adjacent to one another. In some embodiments, removing the DGI forms the void. Additionally, or alternatively, the growth surface may be etched prior to removing the DGI to form etched regions. The diamond growth inhibitor may function as a mask that prevents or reduces the formation of etched regions beneath the diamond growth inhibitor. The diamond growth inhibitor may be positioned over a second diamond inhibition area of the growth surface. The method may etch the growth surface to form a second etched region. The diamond growth inhibitor thus may function as a mask preventing or reducing the formation of the second etched regions beneath the diamond growth inhibitor. The method may also deposit a second diamond portion having a second dopant concentration using chemical vapor deposition. The second diamond portion may have a different dopant concentration from the first diamond portion.

Among other steps, the method may remove the diamond growth inhibitor over the second diamond inhibition area of the growth surface. The first doped diamond portion and the second doped diamond portion may be single crystal diamond. The carbon deposited over the diamond growth inhibitor may be amorphous carbon. The first doped diamond portion and the second doped diamond portion may form a p-n junction or PIN diode. The first doped diamond portion and the second doped diamond portion form a semiconductor device. Some embodiments may trace lines to contact pads and electrically couple the device to a power source.

Among other things, the diamond growth inhibitor may be formed from gold and/or aluminum oxide. The adherence portion may be positioned between the DGI and the diamond growth surface. In various embodiments, amorphous carbon forms on the diamond growth inhibitor when depositing diamond using chemical vapor deposition. A silicon pad may be positioned on the single crystal diamond substrate. Polycrystalline diamond may be grown over the silicon pad. The diamond growth inhibitor may be removed by polishing.

In some embodiments, the first doped portion and the second doped portion may be embedded by depositing undoped diamond over the growth surface. Doped diamond of a given color may be selectively deposited to form a logo in the diamond. A second doped diamond of a different given color may be selectively deposited to form the logo in the diamond.

Illustrative embodiments may provide a diamond grown using any of the above processes.

In accordance with other embodiments, a diamond includes a single-crystal undoped diamond. The diamond also has a first single-crystal diamond portion having a first dopant concentration embedded in the single crystal diamond. Furthermore, the diamond may include a second single-crystal diamond portion having a second dopant concentration embedded in the single crystal diamond.

Among other things, the first single-crystal diamond portion may be boron doped and/or the second single-crystal diamond portion may be nitrogen doped. The first single-crystal diamond portion and the second single-crystal diamond portion may be embedded in the undoped diamond. The first single-crystal diamond portion and the second single-crystal diamond portion may form a junction.

In some embodiments, the diamond may include a diamond growth inhibitor formed from gold and/or aluminum oxide. The first doped diamond portion and the second doped diamond portion may form a p-n junction and/or a semiconductor device. The semiconductor device may be a transistor and/or an LED.

In some embodiments, the first doped diamond portion is boron doped and the second doped diamond portion is nitrogen doped. Alternatively, the first dopant concentration and the second dopant concentration may include different levels of the same dopant. The first dopant concentration and the second dopant concentration may include different dopants. Additionally, or alternatively, the second dopant concentration may include no dopants. The dopant concentrations may include dopants that alter the electrical or optical properties of diamond. The dopants may include boron, nitrogen, silicon, phosphorous, and/or nickel. In some embodiments, the single crystal substrate may be intrinsically undoped diamond.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, an epitaxial growth process is used to grow diamonds having junctions. The junctions may occupy the same layer(s) of the diamond. A diamond growth inhibitor is used to provide a void in the diamond as it is grown epitaxially, such that the void may be filled with a differently doped diamond. Details of illustrative embodiments are discussed below.

Figure 1A:
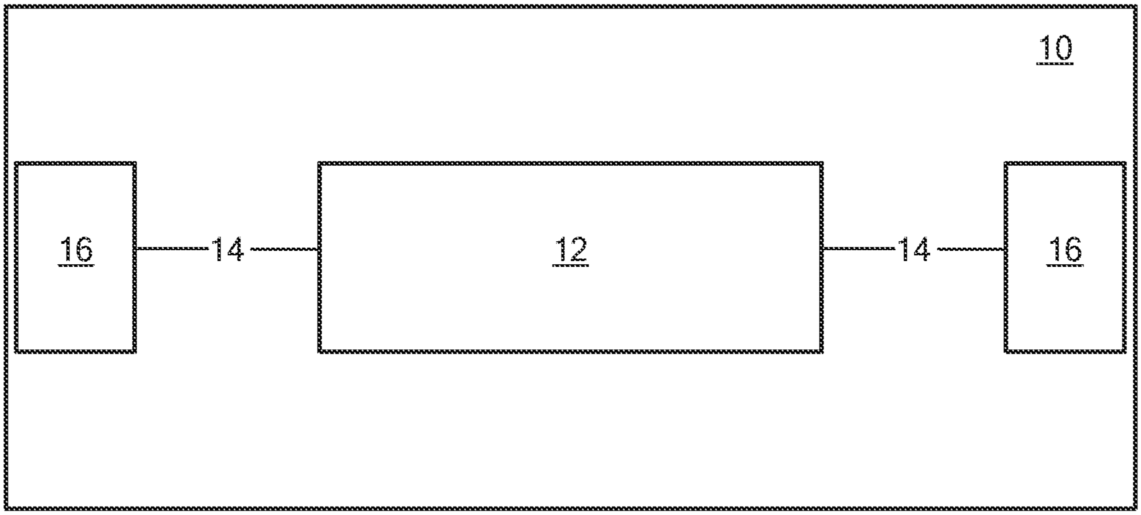
FIG. 1A schematically shows a top view of a diamond grown in accordance with illustrative embodiments of the invention.

FIG. 1A schematically shows a top view of a diamond 10 grown in accordance with illustrative embodiments of the invention. The diamond 10 may be single-crystal or polycrystalline. However, preferred embodiments grow a single-crystal diamond 10.

The diamond 10 may include a grown semiconductor device 12, such as a transistor grown on or in the diamond 10. However, it should be understood that any other sort of semiconductor device 12 may be grown, and illustrative embodiments are not limited to transistors. Various embodiments may include wires 14 and contact pads 16 to power the device 12. It may therefore be desirable to grow contact pads 16 in the diamond 10. For example, the contact pads 16 may be formed from boron-doped diamond 10.

Figure 1B:
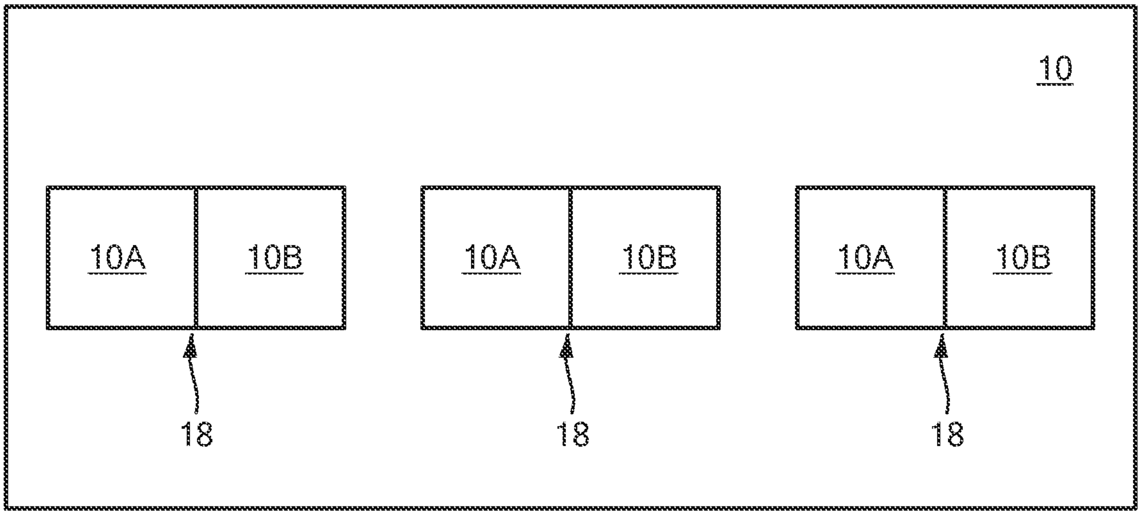
FIG. 1B schematically shows another embodiment of the diamond with p-n junctions.

FIG. 1B schematically shows another embodiment of the diamond 10 with p-n junctions. For example, the diamond 10 may have a series of junctions 18 of boron-doped diamond 10A (p-type) and nitrogen-doped diamond 10B (n-type). Although reference numeral 10A refers to boron-doped diamond/p-type and reference numeral 10B refers to nitrogen-doped diamond/n-type, these reference numerals are used to distinguish between diamond 10 portions having different dopant concentrations. Thus, as used throughout this application, reference numeral 10A is not limited to nitrogen-doped diamond, and reference numeral 10B is not limited to boron-doped diamond.

In various embodiments, the junction 18 is a boundary or interface between two differently doped semiconductor materials (e.g., p-type diamond 10A and n-type diamond 10B), embedded inside, or on a surface of, a single crystal of semiconductor. As known by those skilled in the art, the "p" (positive) side contains an excess of holes, while the "n" (negative) side contains an excess of electrons in the outer shells of the electrically neutral atoms. This allows electrical current to pass through the junction 18 only in one direction. The p-n junction 18 is created by doping, using epitaxy (e.g., growing a portion of the diamond 10 doped with one type of dopant on top of or adjacent to a portion of the diamond 10 doped with another type of dopant). Advantageously, illustrative embodiments enable the differently doped diamond 10 portions (e.g. the junction 18) to be grown in the same layer.

FIGS. 2A-2D schematically show a diamond 10 being grown in accordance with illustrative embodiments. As will be described further below, selective deposition of diamond 10 having different concentrations of dopants allows for the creation of junctions 18, such as p-n junctions. Additionally, doping of diamond 10 causes color changes in the diamond 10. Accordingly, illustrative embodiments may also be used to selectively change the color of various portions of the grown diamond 10. In some embodiments, a diamond 10 may be grown with a logo or other desirable visual appearance using the processes described herein. The logo may be embedded within the diamond 10 and/or on the surface.

Figure 2A:
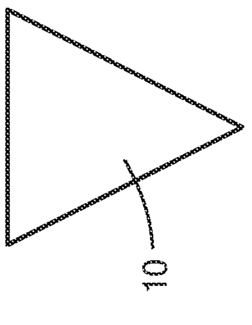
FIGS. 2A-2D schematically show a diamond being grown in accordance with illustrative embodiments.

FIG. 2A shows a side view of the diamond 10 being grown in accordance with illustrative embodiments. The diamond 10 may be grown in a CVD reactor using known diamond 10 growth conditions. For example, some embodiments may homoepitaxially grow the diamond 10 (e.g., using a single crystal diamond 10 seed). Other embodiments may grow the diamond 10 hetero-epitaxially. The diamond 10 of FIG. 2A may be grown with a first given dopant concentration (which may include intrinsically undoped). Additionally, the diamond 10 may include a variety of dopant concentrations. The diamond 10 may be grown using CVD conditions known in the art, including those described in U.S. patent application Ser. No. 17/153,403, which is incorporated herein by reference in its entirety.

Figure 2B:
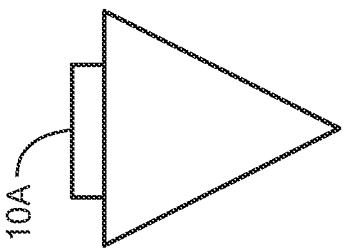

As shown in FIG. 2B, the portions of the diamond 10A may be grown with a different dopant concentration from the remainder or bulk of the diamond 10. As known to those skilled in the art, changes in dopant concentration may cause a change in the color of the diamond material. Therefore, illustrative embodiments may be used to selectively deposit diamond 10A having a different concentration from the base concentration of the diamond 10 in order to create a visual impression, such as a logo. Methods of doping diamond 10 to form desirable colors are described in U.S. patent application Ser. No. 17/150,751, which is incorporated herein by reference in its entirety. Various embodiments may dope the diamond 10 as described in the referenced application to produce portions of the diamond 10 that are colorless and/or colored on a diamond color scale, for example.

Figure 2C:
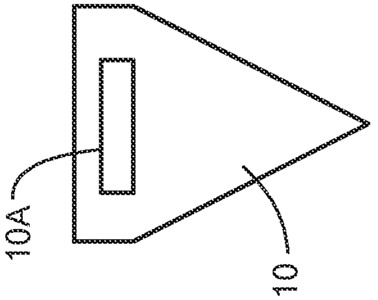

FIG. 2C shows the diamond 10 having the first dopant concentration being grown over the logo (formed by diamond 10A having the second dopant concentration), such that the logo becomes embedded within the diamond 10 gemstone.

Figure 2D:
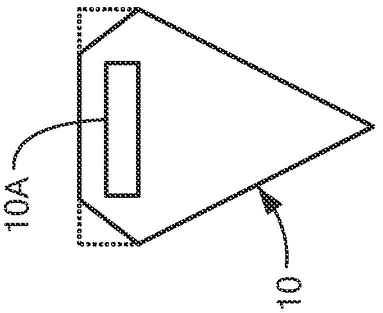
Figure 2E:
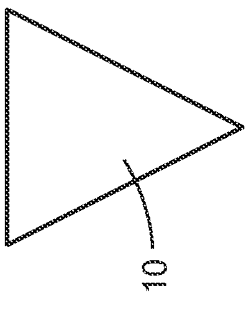
FIGS. 2E-2H schematically show a diamond being grown in accordance with illustrative embodiments.
Figure 2F:
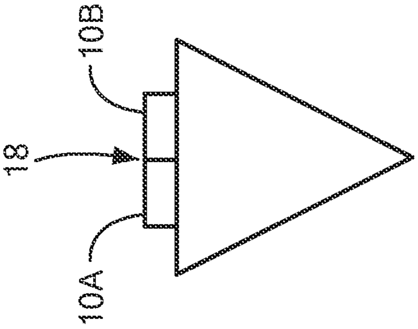
Figure 2G:
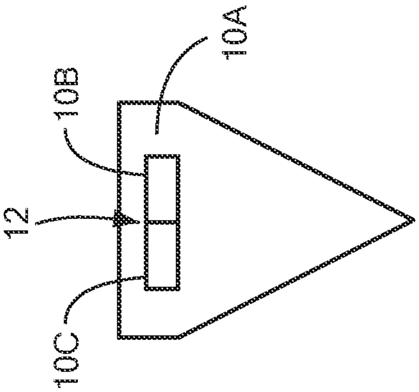
Figure 2H:
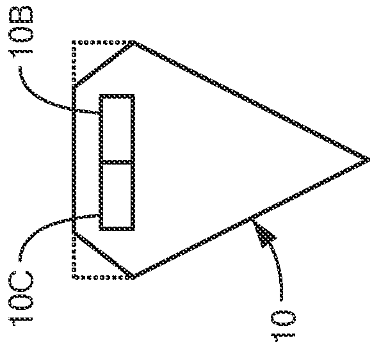

FIG. 2D shows a round brilliant shape being cut from the bulk grown stone 20. Thus, a customer may see the logo formed by diamond 10A embedded in the diamond 10 when looking down on the top of the diamond 10.

Although FIGS. 2A-2D refer to the growth of a logo or other visually distinctive feature, it should be understood that various embodiments may be used to grow embedded devices 12 in a similar manner. For example, a device 12 such as a p-n junction 18 may be grown, as shown in FIG. 2E-2H. The p-n junction 18 may be encapsulated.

FIGS. 3A-3I schematically show selective deposition of diamond 10 in accordance with illustrative embodiments. The inventors discovered that certain materials function as diamond growth inhibitors 20 when epitaxially growing diamond 10 using CVD. The diamond growth inhibitor 20 prevents and/or inhibits single crystal or polycrystalline diamond 10 growth under CVD growth conditions. In various embodiments, diamond 10 growth is inhibited such that no more than a negligible amount of diamond bonds to the DGI, such that diamond bonds are not detectable using X-ray diffraction.

Instead, the deposited carbon is in the form of non-diamond carbon (e.g., amorphous) deposit thereon (instead of diamond 10 carbon), which is easily removed (e.g., blown away) and/or wiped away. The non-diamond carbon may be removed using chemical cleaning, including wet or dry processes, which may be used to fully remove carbon residue—this is generally non-destructive to the diamond 10. Various embodiments may use hydrogen plasma cleaning In particular, gold and/or aluminum oxide may be used as diamond growth inhibitors 20. Accordingly, diamond growth inhibitor 20 may be placed over portions of the growth surface 11 to selectively prevent diamond 10 growth. However, due to the robustness of Al2O3, it is generally is harder to remove than gold 20.

For the sake of discussion, various embodiments may refer to gold 20 and DGI 20 interchangeably. However, it should be understood that any reference to gold 20 is intended to apply to DGI 20 generally, and is not limited to DGI 20 formed from gold.

Figure 3A:
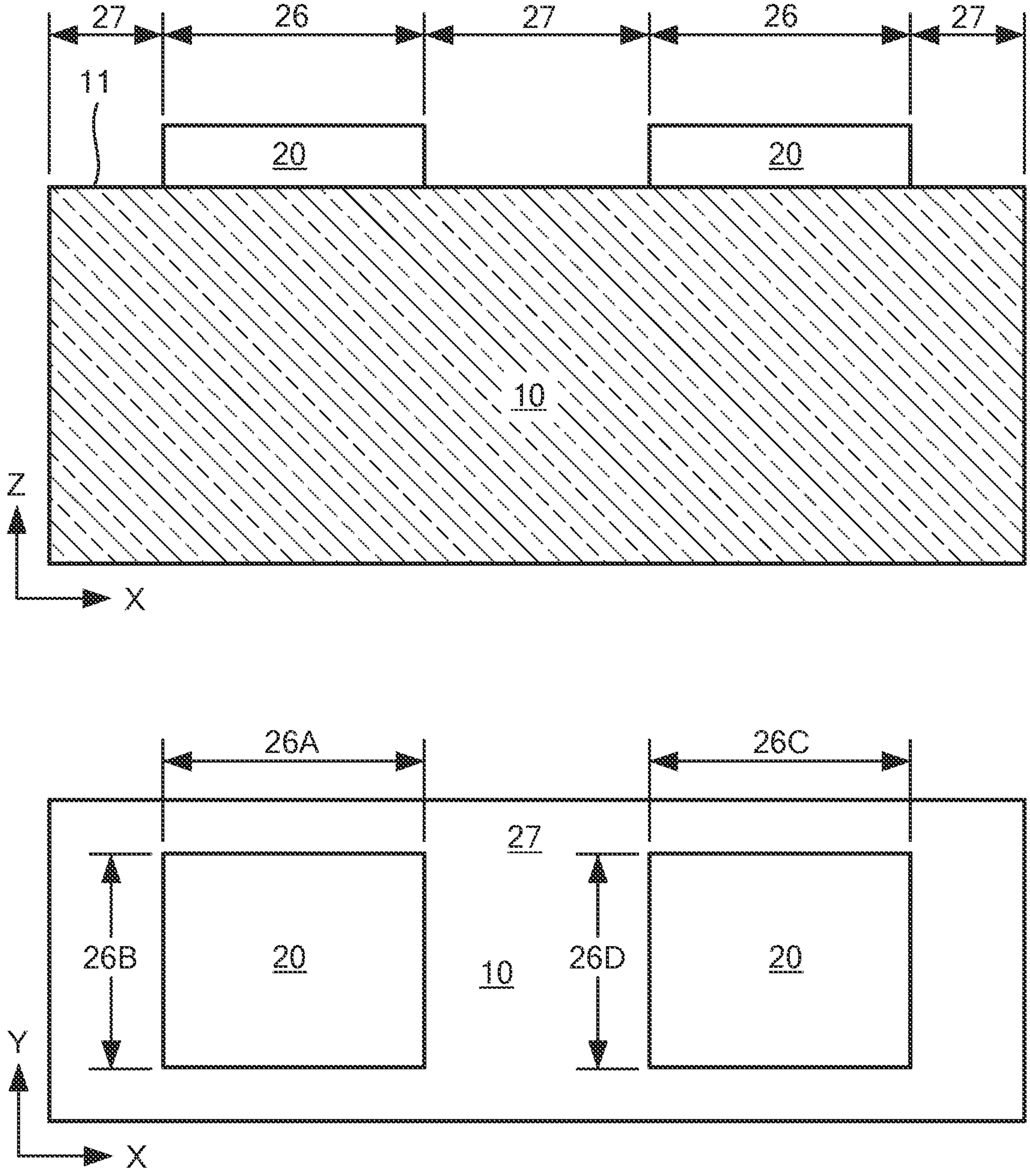
FIGS. 3A-3I schematically show selective deposition of diamond in accordance with illustrative embodiments.

FIG. 3A schematically shows a side view (i.e., in the Z-axis and X-axis plane) and a top view (i.e., in the X-axis and Y-axis plane) of a grown diamond 10 material having diamond growth inhibitor 20 ("DGI"), such as gold pads, over a first diamond inhibition area 26 of the growth surface 11 (defined by the perimeter formed by 26A and 26B, and the perimeter formed by 26C and 26D). This area may be referred to as the diamond inhibition area 26. The remainder of the growth surface 11 that is uncovered by DGI 20 may define an area 27 on which diamond grows during the diamond CVD process (referred to as a diamond growth area 27).

Figure 3B:
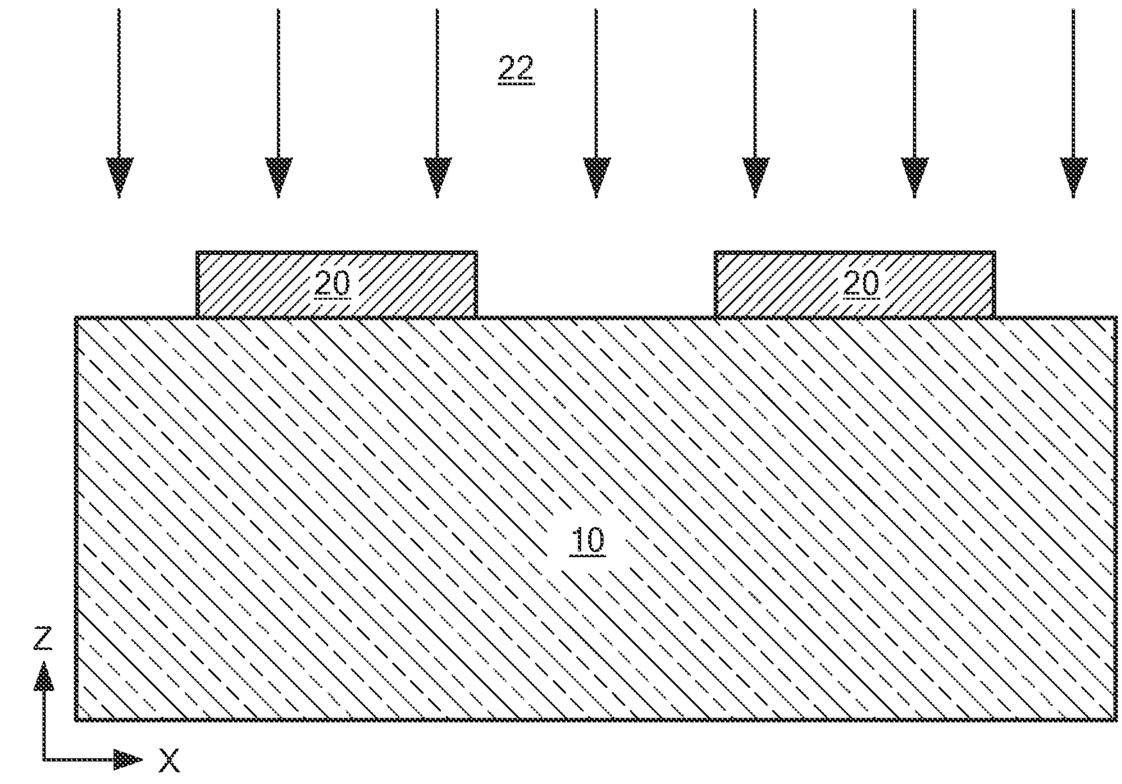

FIG. 3B schematically shows that the entire diamond 10 can be put into an ion etch tool (e.g., ICP-RIE dry etch tool). The etch tool ablates the diamond 10 surface with ions 22 (shown in FIG. 3B). Advantageously, the DGI 20 serves as a hard mask, which prevents the diamond 10 beneath the gold from being etched. Thus, after etching, the diamond 10 looks like FIG. 3C, with voids 21 (e.g., etched out portions 21) that did not have gold 20 thereover (shown in dashed lines). Illustrative embodiments may form voids 21 by etching growth areas 27 not protected by DGI 20 (e.g., FIG. 3G), and/or by growing diamond adjacent to diamond inhibition areas 26, 28 covered by DGI 20 (e.g., FIG. 5C) Accordingly, illustrative embodiments may refer to voids 21 as etched out portions 21 depending on the context.

Figure 3C:
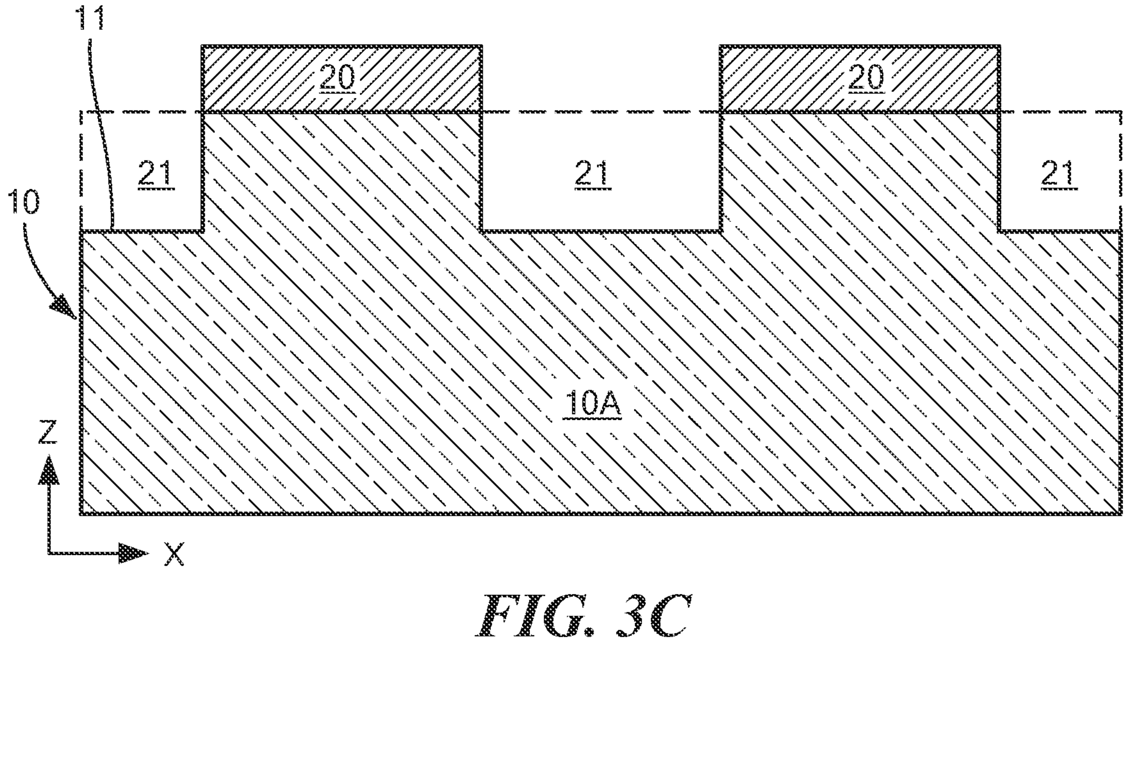
Figure 3D:
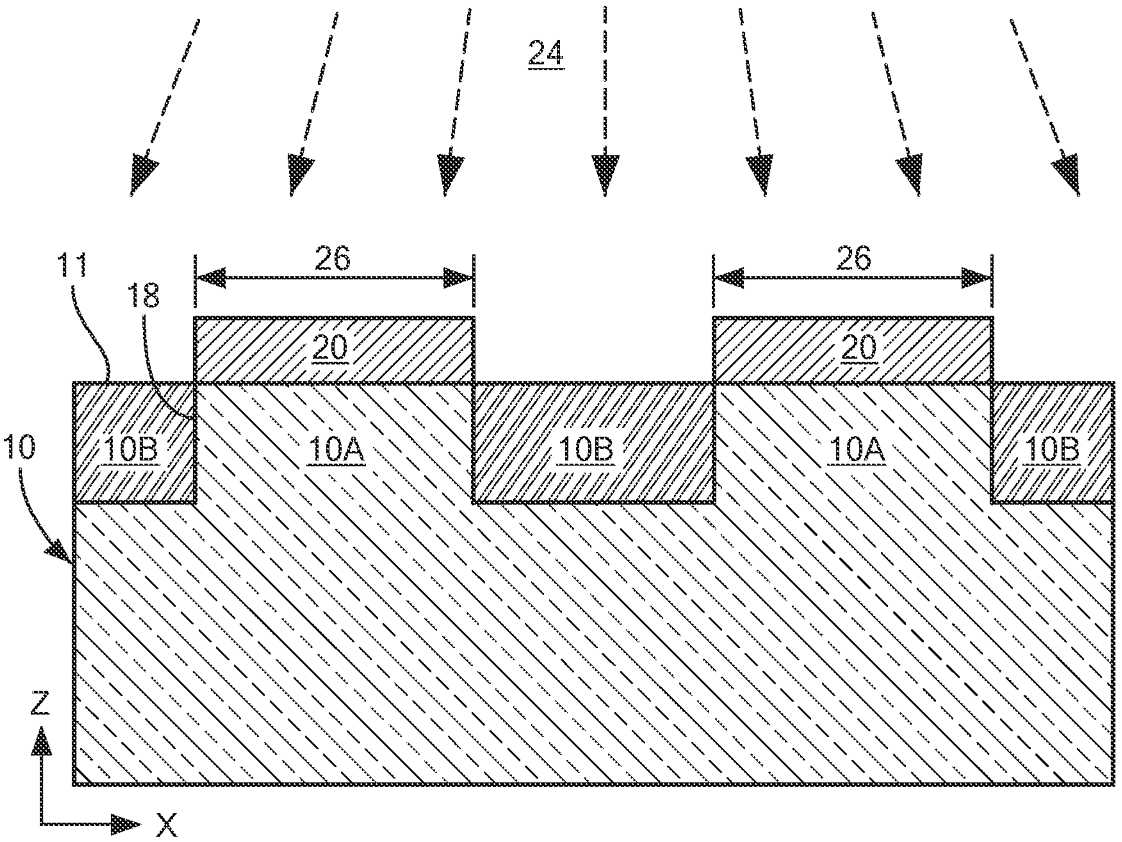

The diamond 10 is then positioned in the CVD chamber for diamond deposition 24. Although illustrative embodiments refer to depositing 24 diamond, it should be understood that carbon 24 is deposited, and that the conditions of the CVD chamber and the growth substrate cause the deposited carbon 24 to form diamond bonds. The diamond 10 has a first dopant concentration labeled as 10A. As shown in FIG. 3D, when additional diamond having a second dopant concentration is deposited 24, diamond 10B is grown in the previously etched portion 21. Notably, diamond 10 growth is inhibited over the diamond growth inhibitor 20. For example, illustrative embodiments may grow boron-doped diamond 10B (blue areas) in the areas that were previously etched, while amorphous soot gathers over the diamond growth inhibitor 20.

Figure 3E:
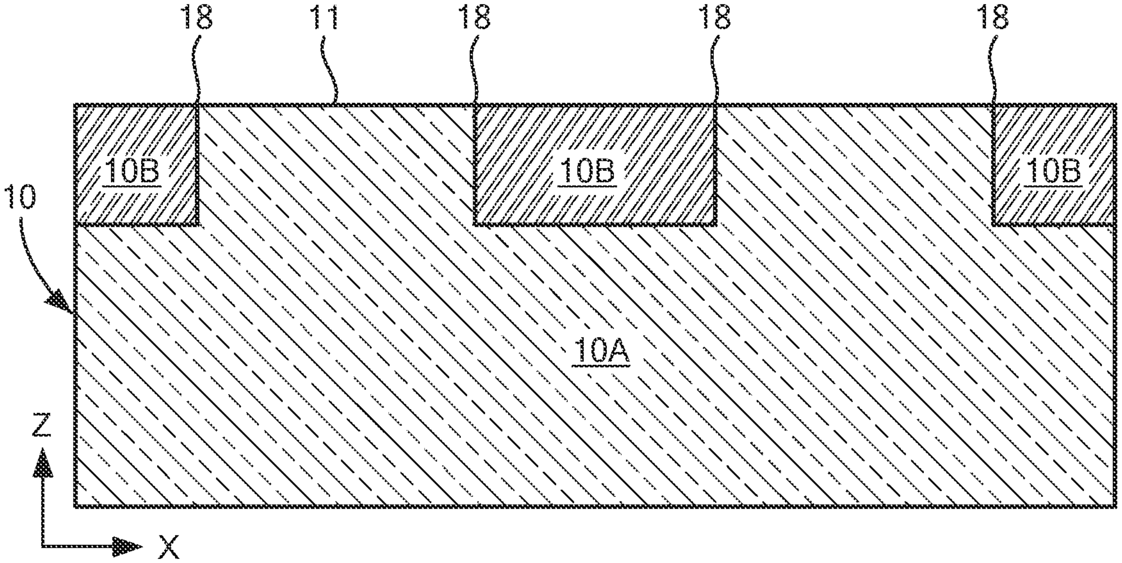

As shown in FIG. 3E, the gold pads 20 may be removed by polishing the diamond 10 and/or chemically (e.g., using aqua regia). Accordingly, the end product may include a top planar growth surface 11 with boron doped diamond portions 10B embedded in the diamond 10. In the current example, the diamond 10 includes a junction 18 with regions between p-type 10B and intrinsic undoped diamond 10A (purple). The above process can be repeated again, for example, to create p-n junctions 18.

Figure 3F:
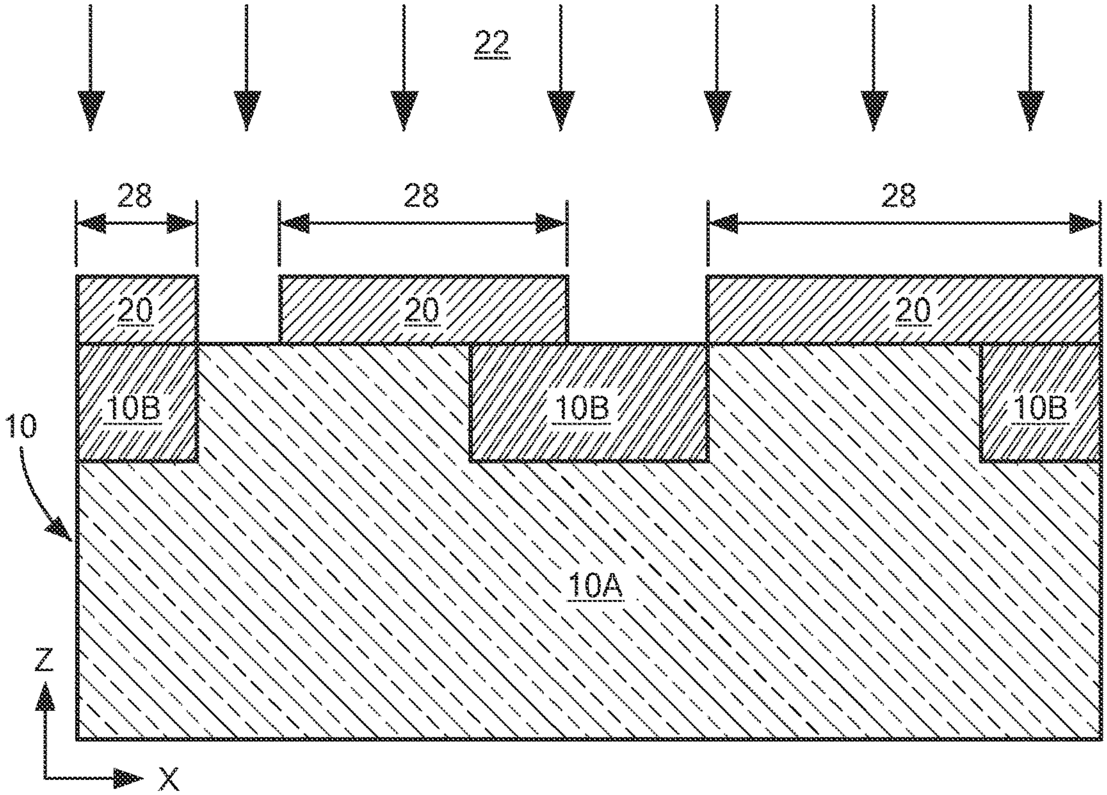
Figure 3G:
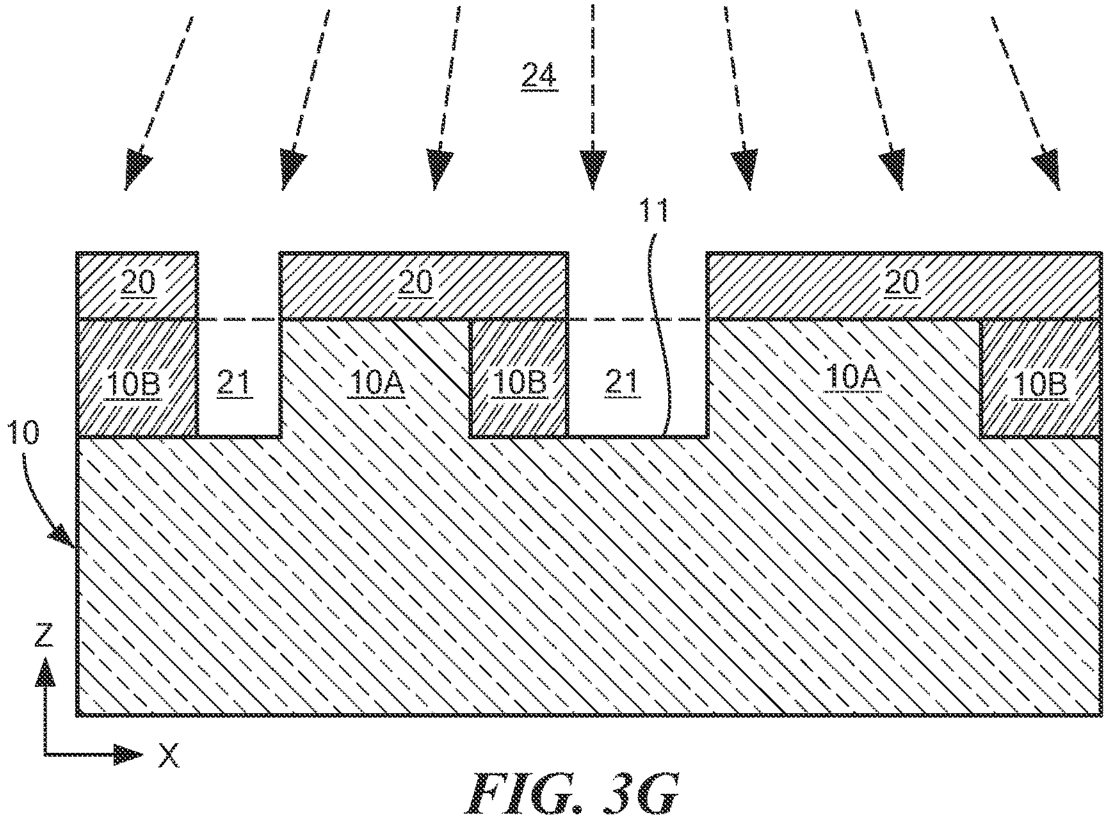
Figure 3H:
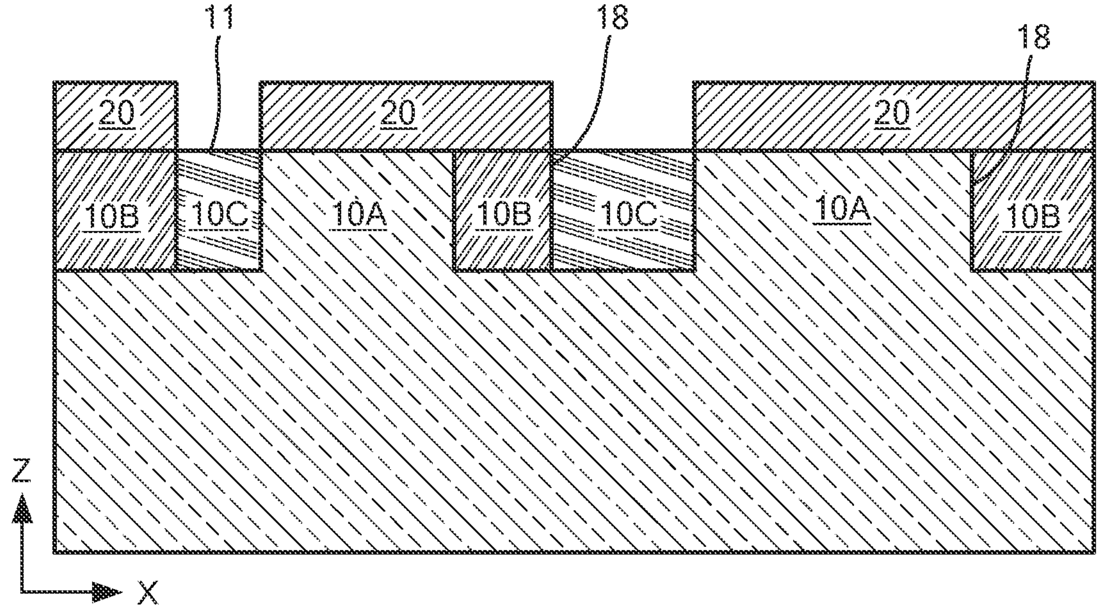
Figure 3I:
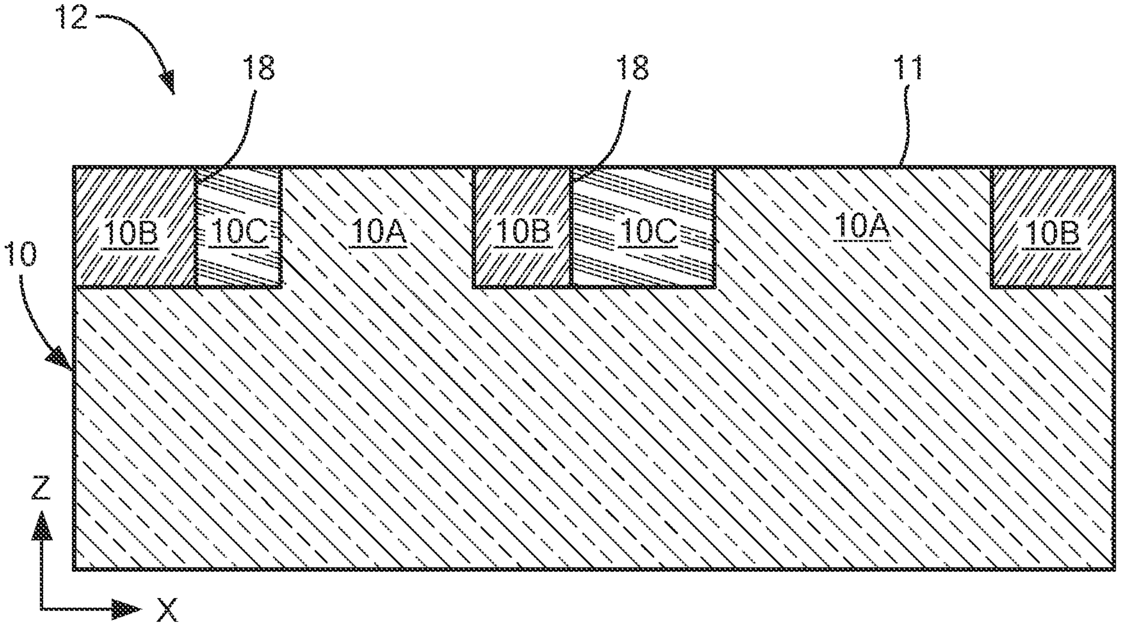

FIG. 3F schematically shows adding new gold pads 20 to the diamond 10 of FIG. 3E (over a second diamond inhibition area 28 thereof). Preferably, the second diamond inhibition area 28 has at least some non-overlapping portions with the first diamond inhibition area 26, or vice-versa (e.g., when viewed from a top view, such that junctions may be formed between differently doped diamond portions 10B and 10C). The diamond 10 again is etched 22, and the diamond growth inhibitor 20 serves as a mask to prevent etching of the diamond 10 beneath. FIG. 3G schematically shows the diamond 10 of FIG. 3F after etching (e.g., dry etching). The diamond includes newly etched portions 21. A differently doped diamond 10C may be deposited (e.g., represented by yellow in FIG. 3H). The surface 11 may then be polished to result in a smooth device 12 surface (as shown in FIG. 3I).

Advantageously, illustrative embodiments use DGI 20 (e.g., gold 20) as a hard mask in an ion etch and as a diamond growth inhibitor 20. Illustrative embodiments include a process that trenches out portions of the first doped diamond 10A material, and then deposits a differently doped diamond 10B or other material within the trenches. Illustrative embodiments provide a simple production method for creating doped regions in the diamond 10.

It should be apparent that various embodiments provide a number of advantages. For example, it is difficult to control the location of deposited diamond 10 in a CVD reactor. For example, CVD process may include difficult to control plasma, deposition isn't line of sight, and there are many other challenges known by those of skill in the art. In general, diamond 10 is deposited 24 over an entire surface 11, and the diamond 10 is single crystal where exposed (e.g., for homoepitaxial growth). If a mask is formed from silicon or molybdenum, diamond 10 deposits across the entire surface (and on the silicon or molybdenum). Furthermore, the diamond 10 deposited 24 over the silicon and molybdenum is polycrystalline diamond 10. The carbon that deposits 24 over the diamond growth inhibitor 20 is not polycrystalline diamond 10. Instead, the carbon forms something akin to an amorphous soot that is easily removed (e.g., chemical cleaning. H2 Plasma). Thus, illustrative embodiments do not deposit diamond 10 over areas where the gold 20 is (or other diamond growth inhibitor 20). This is not true with other typical materials.

Accordingly, illustrative embodiments control where the diamond 10 grows and where it doesn't. The carbon soot may be blown off with an air gun, sonicated, or otherwise easily removed.

Figure 4:
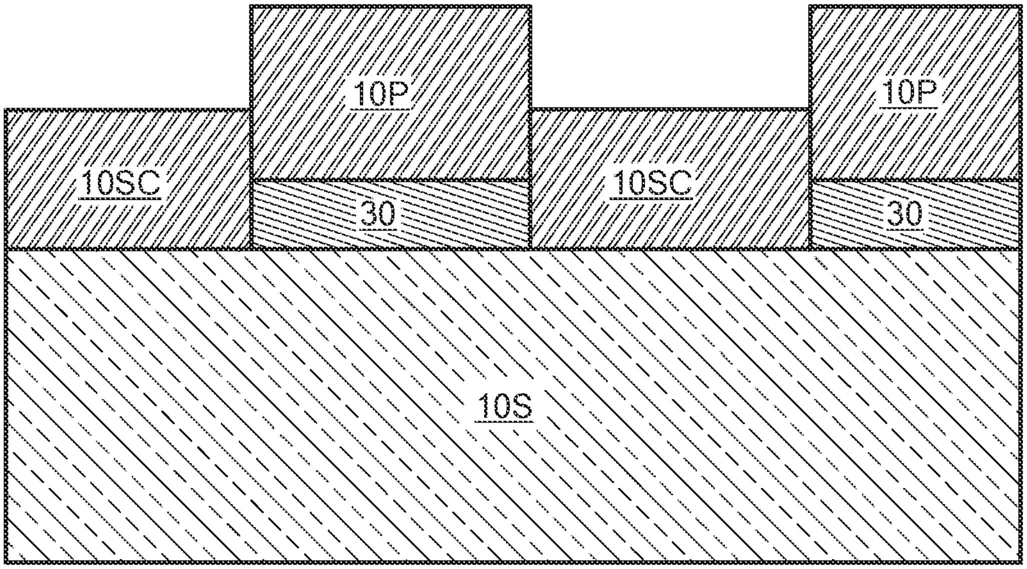
FIG. 4 schematically shows growing diamond using a different mask material, such as silicon, in accordance with illustrative embodiments.

FIG. 4 schematically shows growing diamond 10 using a different mask material, such as silicon 30. When a single crystal diamond substrate 10 is provided, CVD process may be used to grow single crystal diamond 10SC regions thereover. However, instead of preventing diamond 10 growth, polycrystalline diamond 10P is grown over the other material (e.g., the silicon 30).

Thus, various embodiments may deposit doped diamond 10 over the silicon pads 30, but the entire diamond growth surface 11 becomes covered with doped diamond 10 (i.e., including over the silicon pads 30). It therefore becomes difficult to get an interface between two differently doped diamond 10 portions. One option is to polish the diamond 10, which makes the diamond 10 planar. However, the adjacent regions are the same dopant concentration with different crystalline forms. Furthermore, the silicon pad 30 is trapped underneath the polycrystalline diamond 10P. Furthermore, a chemical process to get rid of the polycrystalline diamond 10P may remove the single crystal diamond 10SC as well (and vice-versa). However, some embodiments may use preferential etching. Therefore, using a non-diamond growth inhibitor 20 material requires removal of the entire layer, and undesirably results in the non-DGI material (e.g., silicon 30) becoming embedded in the diamond device 12.

Figure 5A:
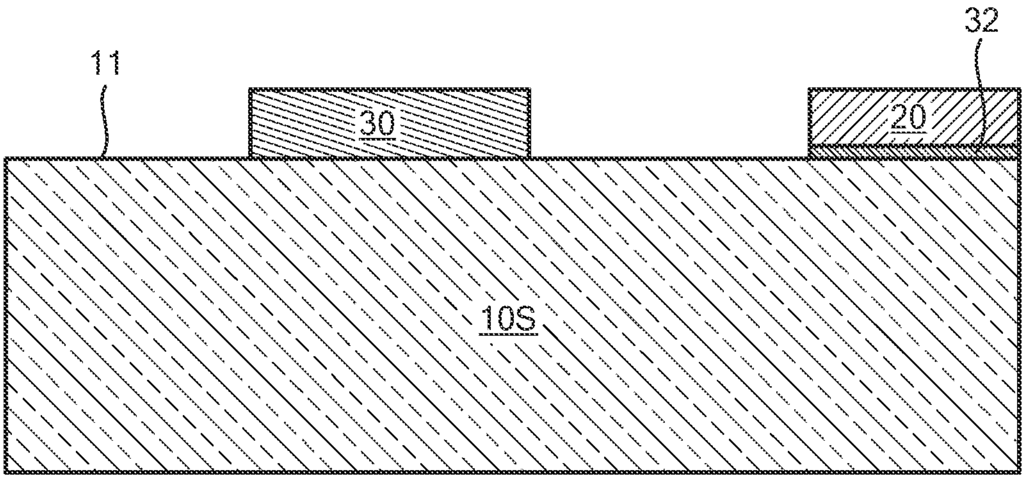
FIG. 5A schematically shows a diamond having a silicon pad and a gold pad in accordance with illustrative embodiments.
Figure 5B:
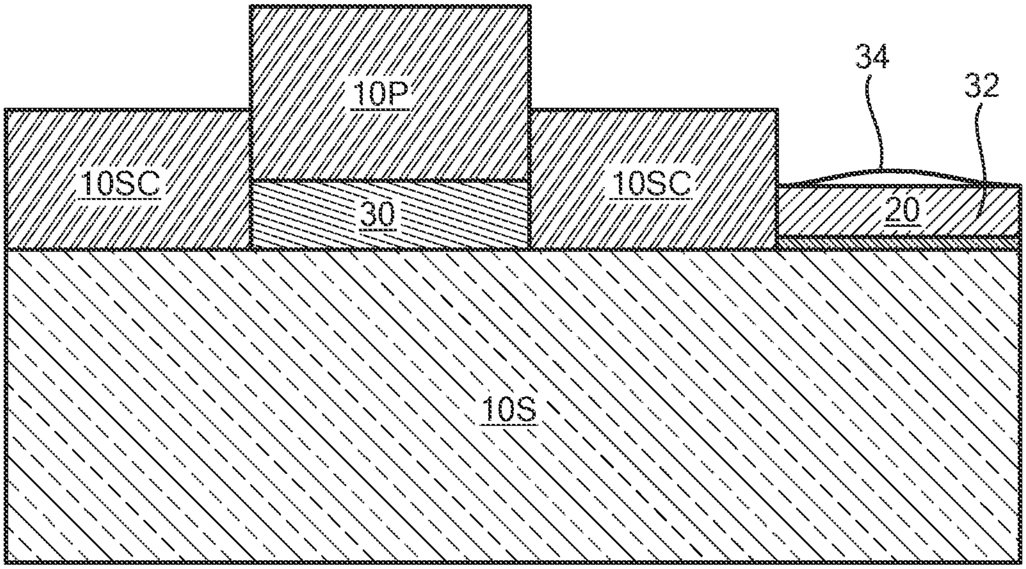
FIG. 5B schematically shows the diamond of FIG. 5A after carbon is deposited over the diamond.

FIG. 5A schematically shows a diamond 10 having a silicon pad 30 and a gold pad 20 in accordance with illustrative embodiments. FIG. 5B shows the diamond 10 of FIG. 5A after carbon is deposited 24 over the diamond 10. Single-crystal diamond 10SC (blue) is grown on top of the single-crystal diamond substrate 10S. Polycrystalline diamond 10P is grown on the silicon pad 30, and an amorphous powder 34 is deposited on top of the gold 20. Most of the amorphous carbon 34 is removed by hydrogen during the growth process. The amorphous carbon 34 generally forms a white powder that is easily removed (not a rigid material).

It can be challenging to deposit gold 20 on carbon, such as diamond substrate 10S. Thus, various embodiments may include a small layer of adherence material/an adhesion layer 32 (e.g., angstrom-nanometer scale formed from chrome, molybdenum, and/or titanium) between the gold 20 and the diamond substrate 10S. Various embodiments may include an adherence layer 32 of between about 10 nanometers and about 20 nanometers in thickness. Some embodiments may include an adherence material 32 that is up to 1 micron in thickness. As used herein, DGI 20 is considered to be deposited on or over the diamond 10 substrate even when an adherence material 32 is added therebetween.

Figure 5C:
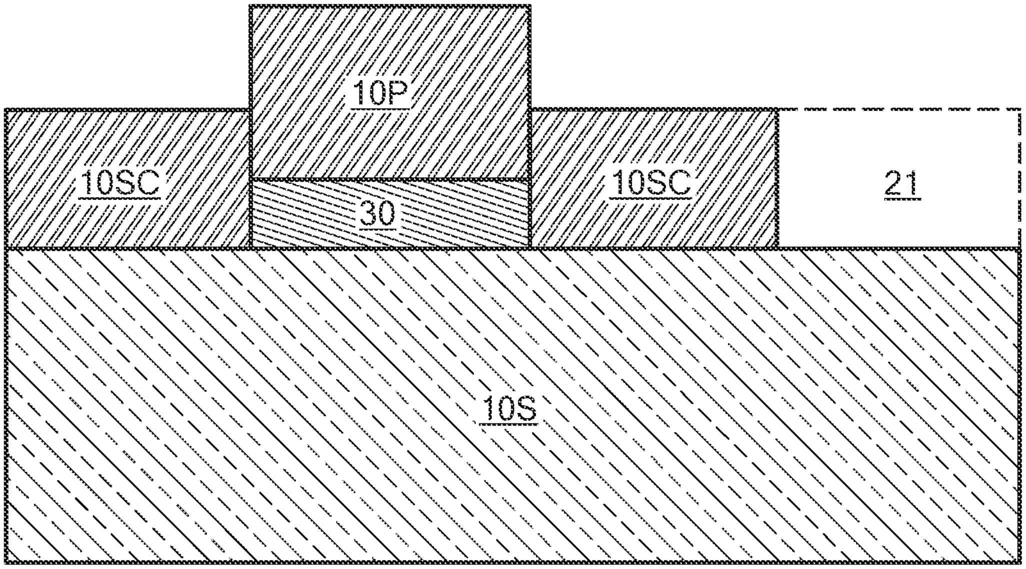
FIG. 5C schematically shows the diamond of FIG. 5B after the diamond grown inhibitor is removed.

FIG. 5C schematically shows the diamond 10 of FIG. 5B after the diamond grown inhibitor 20 is removed. Additionally, the amorphous powder 34 may be removed before or with the diamond growth inhibitor 20. Furthermore, as shown, optionally the adherence material 32 may be removed. To that end, a wet etch/aqua regia, or a polish (also helps to get rid of molybdenum 32 between gold pads 20) may be used to help remove the diamond growth inhibitor 20, the amorphous powder 34, and/or the adherence material 32. After removal, the void 21 remains relative to diamond 10SC, 10P deposited on a second portion of the growth surface.

Figure 6:
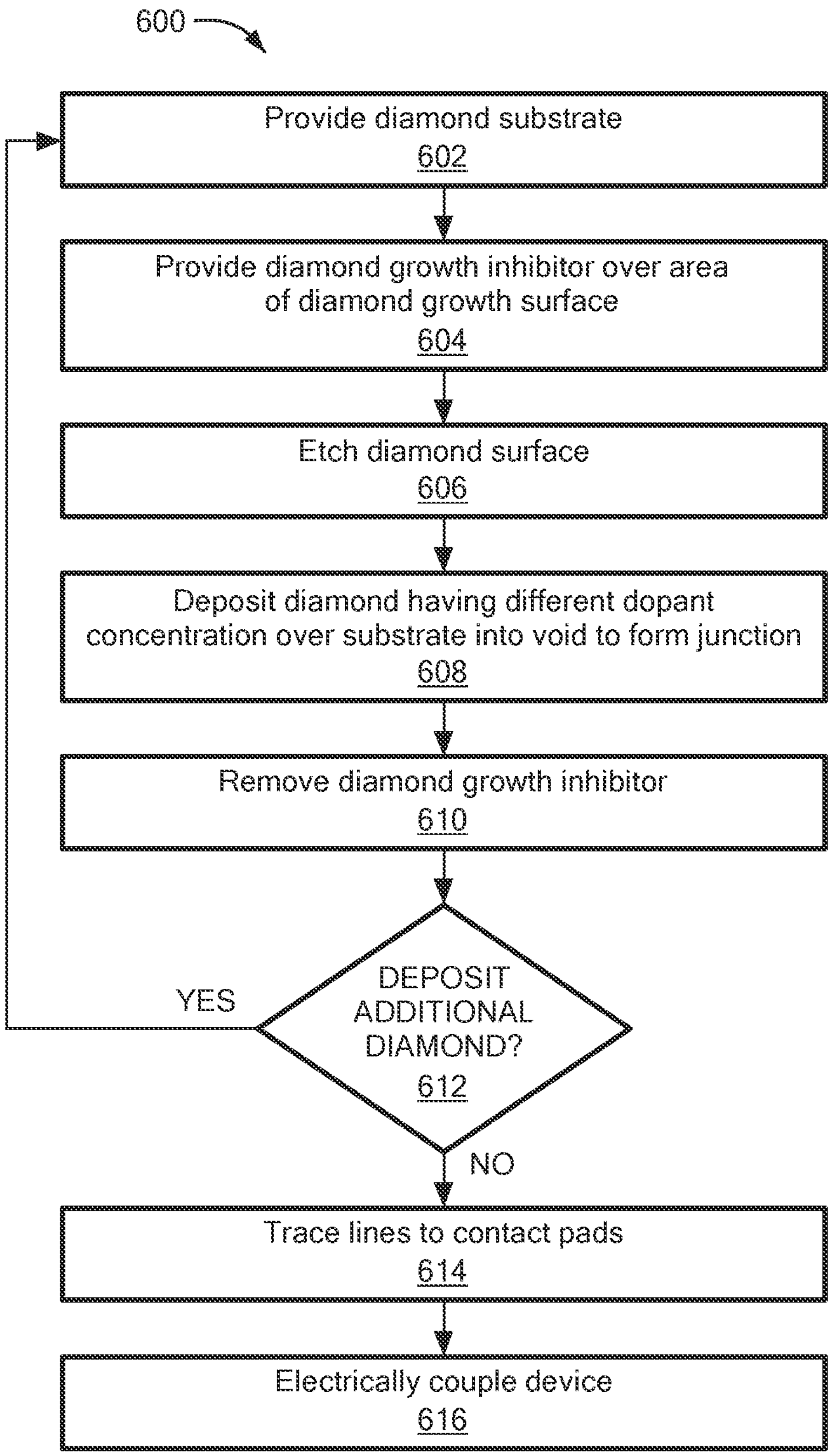
FIG. 6 schematically shows a process for growing single crystal diamond junction in accordance with illustrative embodiments of the invention.

FIG. 6 schematically shows a process for growing single crystal diamond 10 junction 18 in accordance with illustrative embodiments of the invention. It should be noted that this method is substantially simplified from a longer process that may normally be used. Accordingly, the method shown in FIG. 6 may have many other steps that those skilled in the art likely would use. In addition, some of the steps may be performed in a different order than that shown, or at the same time. Furthermore, some of these steps may be optional in some embodiments (e.g., steps 606, steps 614 and/or 616). Accordingly, the process 600 is merely exemplary of one process in accordance with illustrative embodiments of the invention. Those skilled in the art therefore can modify the process as appropriate.

The process begins at step 602 by providing a diamond 10 substrate. Preferably, the diamond 10 substrate is single-crystal diamond 10. The process then proceeds to step 604, which provides a diamond growth inhibitor 20, for example a gold pad 20, over the first diamond inhibition area 26 of the diamond 10 substrate, as shown in FIG. 3A. As mentioned previously, an adherence attachment material 32 may be provided between the gold pad 20 and the diamond substrate 10S.

The process then proceeds to step 606, which etches 22 the diamond 10S surface (e.g., using a dry etch). The gold pads 20 serve as a mask, resulting in etched portions 21 under areas 27 where there are no gold pads 20 (FIG. 3C). The process then proceeds to step 608, which deposits 24 diamond 10 (e.g., into the voids 21). In various embodiments, the diamond 10B deposited in step 608, or portions thereof, may have a different dopant concentration from the diamond at the adjacent portion of the growth surface 11 (e.g., the diamond 10 substrate) or portions thereof. For example, the diamond substrate 10S may be formed of undoped diamond 10, and a doped diamond 10 may be deposited thereon in step 608. Alternatively, the substrate 10S may be doped, and an undoped diamond 10 may be deposited thereon. Furthermore, the diamond 10 substrate may have a first dopant concentration (e.g., X ppm boron) and the next layer of diamond 10 deposited thereon may have a second dopant concentration (e.g., Y ppm boron). Additionally, or alternatively, the diamond 10 layers may each have different dopant concentrations portions stacked on top of one another. It should be apparent to one skilled in the art that DGI 20 may be positioned as desired to create areas of deposited doped diamond (e.g., 10A, 10B, 10C, etc.).

Depositing a first doped concentration diamond 10B (e.g., boron doped diamond 10B) into the etched portions 21 (FIG. 3D) forms a junction 18 with the substrate 10A. The doped diamond 10B grows in the voids 21, but not over the gold pads 20. The gold pads 20 thus serve as a mask and then as a growth inhibitor. The gold pads 20 may then be removed at step 610 (FIG. 3E). To that end, the process may use, for example, a wet etch/aqua regia, or a polish (also helps to get rid of molybdenum 32 between gold pads 20).

At this point in the process, one or more junctions 18 are embedded in the material. In various embodiments, the junction 18 is the interface between materials having substantially different dopant concentrations. Examples of junctions 18 include p-n junctions, but are not limited thereto. For clarity, within the context of this application, a diamond 10 referred to as having a dopant concentration may include a diamond 10 having no dopants or substantially no dopants. Thus, undoped diamond is considered to have a dopant concentration.

The process then proceeds to step 612, which asks whether there are additional diamond 10 (e.g., doped diamond 10A, 10B, 10C, etc. portions) to be deposited. If yes, the process returns to step 602, which uses at least part of the diamond 10 of step 610 as the substrate. Gold pads 20 may be coupled to the diamond 10 substrate as described previously, but new pads 20 are partially or entirely repositioned over the new growth surface 11 (as shown in FIG. 3F). The diamond 10 surface is etched again at step 606, but now the etched portions 21 are moved (e.g., laterally, corresponding to portions not covered by gold pads 20). At step 608, a diamond 10C having a dopant concentration, preferably different from the previously deposited dopant concentration 10B, may be deposited on the growth surface 11 (as shown in FIG. 3H).

By forming a junction 18 between two differently doped portions, the device 12 may be formed. For example, illustrative embodiments may create an array of LEDs. Current may flow through the device 12 and photons emit from the junction 18. Illustrative embodiments may thus form a device 12 such as a deep-UV LED. Other devices 12, such as LEDs, field effect transistor, etc. may be formed using the process of FIG. 6.

Additionally, although not shown, additional intrinsic diamond 10A (or other dopant concentration) may be grown over the diamond 10 produced using the process of FIG. 6. Thus, doped layers and/or junctions 18 may be encapsulated throughout the device 12.

Figure 7:
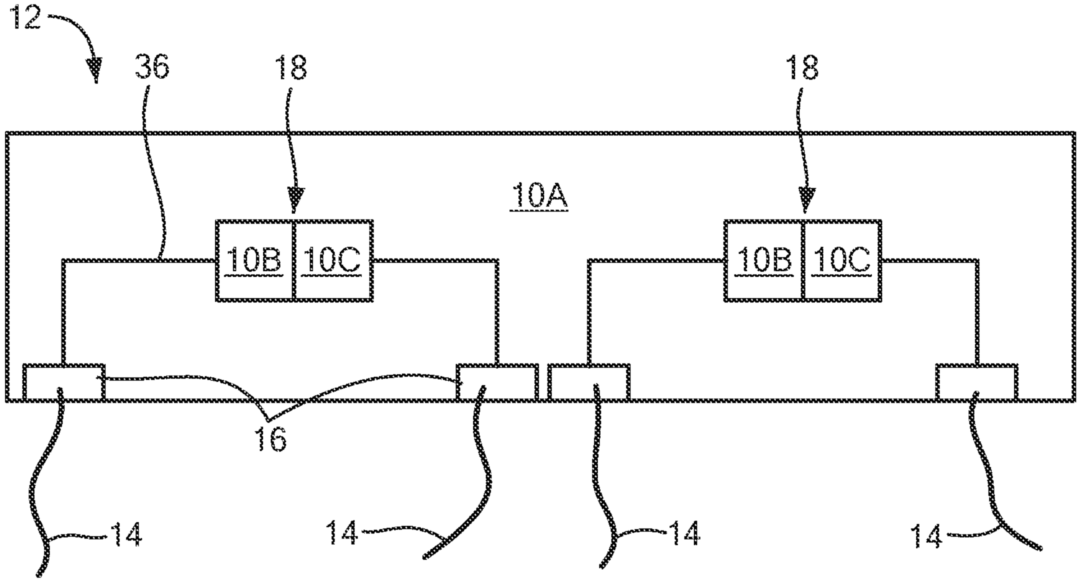
FIG. 7 shows a top view with a junction in accordance with illustrative embodiments.

The process may proceed to step 614, which traces out lines 36 to contact pads 16. FIG. 7 shows a top view with a junction 18 in green and blue. Illustrative embodiments trace out lines 36 to where contact pads 16 are to be positioned (e.g., using lithography). The device 12 may then be taken and diamond 10 may be grown over the top of it. At step 616, the grown device 12 may be electrically coupled. For example, wire 14 (shown in red) may be connected to the sides when done and the device 12 may be packaged as known in the art. Advantageously, the device 12 is protected from radiation (diamond 10 is radiation hard). The process then comes to an end. As described previously, the process of FIG. 6 may be modified for various purposes. For example, when the diamond 10 is grown for optical applications (e.g., doping to create an image/logo, steps 614 and 616 may be skipped).

It should be apparent that illustrative embodiments advantageously provide methods of selective deposition of diamond 10 material such that junctions 18 can be provided along a planar surface of the material. Material that is doped or undoped may be selectively deposited and may be used to provide junctions 18 between materials of different dopant levels or interfaced between doped and undoped materials. This may be done for both aesthetic and electronic applications. In the case of aesthetic, the interface may be between white diamond 10 and diamond 10 that is doped to produce a specific color (e.g. blue) and may be used to create design images, such as a company logo, at the surface or embedded into a diamond 10 gemstone.

In various embodiments, the process for achieving this type of deposition is through the use of gold material as a mask. Another material such as chrome, titanium, or molybdenum may be used between the gold and the diamond 10 for the purpose of improving adhesion of the gold film. The gold film may be patterned either during deposition or after the deposition using, for example, lithographic techniques. If patterning is done during deposition, a shadow mask may be utilized to control where deposition occurs.

Gold has been found to be useful in preventing the deposition of diamond 10 during CVD (chemical vapor deposition) processes. Subsequently, the areas where gold 20 has been applied do not experience deposition.

In various embodiments, the substrate 10S may be exposed to an etching process, such as a dry etch, after the application of the gold layer 20 in order to create voids 21 in the diamond 10. During a subsequent deposition process, diamond 10 can be selectively deposited into the created voids 21 in order to create surface interfaces. It may be necessary to apply an additional layer, such as fluorinated polymer (e.g., PTFE), onto the gold film 20 to protect the gold film during etch. That additional layer may be removed before deposition, such as through a solvent etch, or by exposure to hydrogen plasma.

Alternatively, the non-diamond 10 layers may be removed through a wet etch process, and an additional coating of diamond 10 may be applied across the entire surface. If needed for the application, the surface may them be polished to expose the diamond 10 interfaces of differing dopant concentrations. In the case of aesthetic uses, it may be desirable to leave the interfaces embedded.

Various embodiments may include a battery configured to provide power to one or more devices 12. The battery can include a rechargeable multi-cell battery pack.

Figure 8:
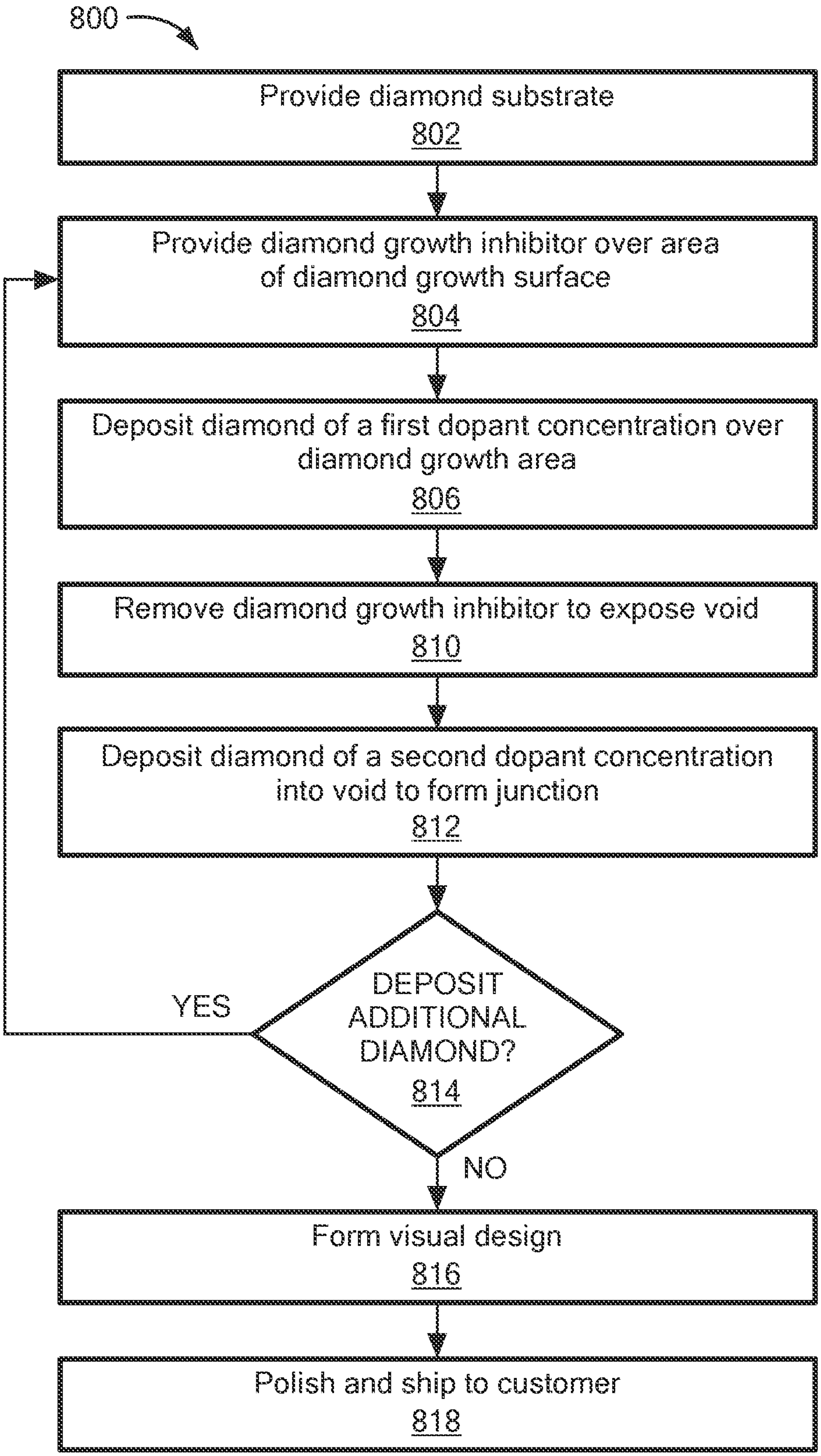
FIG. 8 schematically shows a process for growing single crystal diamond junction in accordance with illustrative embodiments of the invention.

FIG. 8 schematically shows a process for growing single crystal diamond 10 junction 18 in accordance with illustrative embodiments of the invention. It should be noted that this method is substantially simplified from a longer process that may normally be used. Accordingly, the method shown in FIG. 8 may have many other steps that those skilled in the art likely would use. In addition, some of the steps may be performed in a different order than that shown, or at the same time. Furthermore, some of these steps may be optional in some embodiments. Accordingly, the process 800 is merely exemplary of one process in accordance with illustrative embodiments of the invention. Those skilled in the art therefore can modify the process as appropriate.

The process of FIG. 8 is very similar to the process of FIG. 6, and various steps of the two processes may be combined. Furthermore, similar steps are not again repeated here in great detail. The process 800 begins at step 802 by providing a diamond substrate 10S having a diamond growth surface 11. At step 804, DGI 20 is provided over a first diamond inhibition area 26 of the surface 11. At step 806 diamond of a first dopant concentration is deposited over the diamond growth area 11. As described herein, diamond is deposited over non-DGI 20 covered areas 27, whereas non-diamond carbon is deposited over diamond inhibition areas 26, 28, etc. At step 810, the DGI 20 may be removed to expose a void 21 (e.g., see FIG. 5C). At step 812, diamond of a first dopant concentration is deposited over the diamond growth area 11, which now includes the uncovered (with DGI 20) void 21. Accordingly, the junction 18 may be formed.

At step 814, the process asks whether to deposit additional diamond. The process is repeated if yes, or the proceeds to steps 816-818 if no. At step 816, after the desired amount and color of diamond has been deposited, a visual design may be formed in the diamond (e.g., a logo). At step 818, the diamond may be polished and shipped to the customer.

It should be noted that the void 21 formation described in the process of FIG. 8 may be combined with steps for forming voids 21 (e.g., using etching) described in FIG. 6, and vice-versa. In some embodiments, instead of steps 816-818, steps similar to steps 614-616 may be used.

As used in this specification and the claims, the singular forms "a," "an," and "the" refer to plural referents unless the context clearly dictates otherwise. For example, reference to "the first doped portion" in the singular includes a plurality of first doped portions, and reference to "the second doped portion" in the singular includes one or more second doped portions and equivalents known to those skilled in the art. Thus, in various embodiments, any reference to the singular includes a plurality, and any reference to more than one component can include the singular.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein.

It is, therefore, to be understood that the foregoing embodiments are presented by way of example only and that, within the scope of the appended claims and equivalents thereto, inventive embodiments may be practiced otherwise than as specifically described and claimed. Illustrative embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure. Disclosed embodiments, or portions thereof, may be combined in ways not listed above and/or not explicitly claimed. Thus, one or more features from variously disclosed examples and embodiments may be combined in various ways. For example, it is to be understood that the present disclosure contemplates that, to the extent possible, one or more features of any embodiment can be combined with one or more features of any other embodiment.

Various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Although the above discussion discloses various exemplary embodiments of the invention, it should be apparent that those skilled in the art can make various modifications that will achieve some of the advantages of the invention without departing from the true scope of the invention.

What is claimed is:

1. A method of growing diamond, the method comprising:

providing a single-crystal diamond substrate having a growth surface, the single-crystal diamond substrate having an intrinsic dopant concentration;

positioning a diamond growth inhibitor over a diamond inhibition area of the growth surface;

positioning a silicon pad over the single crystal diamond substrate;

depositing a first diamond portion having a first dopant concentration using chemical vapor deposition over a growth area of the growth surface, the first dopant concentration being different from the intrinsic dopant concentration, wherein depositing comprises growing polycrystalline diamond over the silicon pad; and removing the diamond growth inhibitor and non-diamond carbon thereon.

2. The method of claim 1, wherein the diamond growth inhibitor is configured to cause deposition of unbonded or Sp2 bonded carbon.

3. The method of claim 1, further comprising:

etching exposed regions of the growth surface not covered by diamond growth inhibitor, prior to removing the diamond growth inhibitor, to form etched regions, the diamond growth inhibitor functioning as a mask preventing or reducing the formation of etched regions beneath the diamond growth inhibitor;

positioning the diamond growth inhibitor over a second diamond inhibition area of the growth surface;

etching the growth surface to form second etched regions, the diamond growth inhibitor functioning as a mask preventing or reducing the formation of the second etched regions beneath the diamond growth inhibitor; and depositing a second diamond portion having a second dopant concentration using chemical vapor deposition, the second diamond portion having a different dopant concentration from the first diamond portion.

4. The method as defined by claim 3, further comprising removing the diamond growth inhibitor over the second diamond inhibition area of the growth surface.

5. The method as defined by claim 3, wherein the first doped diamond portion and the second doped diamond portion are single crystal.

6. The method as defined by claim 1, wherein amorphous carbon deposits over the diamond growth inhibitor.

7. The method as defined by claim 1, wherein the diamond growth inhibitor is formed from gold.

8. The method as defined by claim 1, wherein the diamond growth inhibitor is formed from aluminum oxide.

9. The method as defined by claim 1, wherein the first doped diamond portion and the second doped diamond portion form a p-n junction or PIN diode.

10. The method as defined by claim 1, wherein the first doped diamond portion and the second doped diamond portion form a semiconductor device.

11. The method as defined by claim 9, further comprising tracing lines to contact pads and electrically coupling the device to a power source.

12. The method as defined by claim 1, wherein amorphous carbon forms on the diamond growth inhibitor when depositing diamond using chemical vapor deposition.

13. The method as defined by claim 1, further comprising an adherence portion between the diamond growth inhibitor and the diamond growth surface.

14. The method as defined by claim 1, further comprising polishing to remove the diamond growth inhibitor.

15. The method as defined by claim 1, further comprising embedding the first doped portion and the second doped portion by depositing undoped diamond over the growth surface.

16. The method as defined by claim 1, wherein doped diamond of a given color is selectively deposited to form a logo in the diamond.

17. A diamond grown using the process of claim 1.

18. A diamond comprising:

a single-crystal undoped diamond;

a first single-crystal diamond portion having a first dopant concentration embedded in the single crystal diamond;

a second single-crystal diamond portion having a second dopant concentration embedded in the single crystal diamond a silicon pad positioned over the single-crystal diamond; and polycrystalline diamond grown over the silicon pad.

19. The diamond of claim 18, wherein the first single-crystal diamond portion is boron doped and/or the second single-crystal diamond portion is nitrogen doped.

* * * * *